US010613139B2

(12) United States Patent
Iranpour et al.

(10) Patent No.: US 10,613,139 B2
(45) Date of Patent: Apr. 7, 2020

(54) SYSTEM AND METHOD FOR ELECTRIC CURRENT LEAKAGE DETECTION IN A LAND SEISMIC SYSTEM

(71) Applicant: WESTERNGECO LLC, Houston, TX (US)

(72) Inventors: Kambiz Iranpour, Oslo (NO); Stefan Johansson, Asker (NO); Hans Paulson, Horten (NO)

(73) Assignee: WesternGeco L.L.C, Houston, TX (US)

( * ) Notice: Subject to any disclaimer, the term of this patent is extended or adjusted under 35 U.S.C. 154(b) by 0 days.

(21) Appl. No.: 16/083,512

(22) PCT Filed: Mar. 15, 2017

(86) PCT No.: PCT/US2017/022385
§ 371 (c)(1),
(2) Date: Sep. 9, 2018

(87) PCT Pub. No.: WO2017/160894
PCT Pub. Date: Sep. 21, 2017

(65) Prior Publication Data
US 2019/0072610 A1 Mar. 7, 2019

Related U.S. Application Data

(60) Provisional application No. 62/308,247, filed on Mar. 15, 2016.

(51) Int. Cl.
G01V 1/22 (2006.01)
G01R 31/3167 (2006.01)
(Continued)

(52) U.S. Cl.
CPC ...... G01R 31/3167 (2013.01); G01P 15/0802 (2013.01); G01R 27/18 (2013.01);
(Continued)

(58) Field of Classification Search
CPC ... G01V 1/18; G01V 1/22; G01V 1/28; G01V 1/36; G01V 1/38; G01V 1/48;
(Continued)

(56) References Cited

U.S. PATENT DOCUMENTS 4,166,270 A 8/1979 Brastins et al.
4,272,725 A 6/1981 Weiner et al.
(Continued)

FOREIGN PATENT DOCUMENTS

EP 0010660 A1 5/1980
KR 1020080105944 A 12/2008
WO 2014145259 A2 9/2014

OTHER PUBLICATIONS

International Preliminary Report on Patentability issued in the related PCT Application PCT/US2017/022385, dated Sep. 18, 2018.
Sercel User's Manual vol. 3, "Sensor Leakage Test," pp. 185-187.
International Search Report and Written Opinion for the equivalent International patent application PCT/US2017/022385 dated May 31, 2017.
Extended Search Report issed in the Corresponding EP Application EP 17767373.8, dated Sep. 26, 2019 (4 pages).

Primary Examiner — Minh N Tang
(74) Attorney, Agent, or Firm — Fletcher Yoder, P.C.

(57) ABSTRACT

Embodiments disclosed herein are directed towards systems and methods for electric current leakage detection in a land seismic system. Embodiments may include generating at least one test signal using a digital to analog converter "DAC" circuitry, wherein the DAC circuitry includes an output operatively connected to earth ground. Embodiments may further include alternately grounding a positive path to an analog to digital converter "ADC" circuitry during a first time window and a negative path to the analog to digital converter during a second time window while measuring an ADC signal. Embodiments may also include determining an average amplitude of the first time window and the second time window and determining a leakage resistance based upon, at least in part, the average amplitude of the first time window and the second time window.

20 Claims, 5 Drawing Sheets

(51) Int. Cl.
*G01R 27/18* (2006.01)
*G01P 15/08* (2006.01)
*G01R 27/20* (2006.01)
*G01V 1/28* (2006.01)
*H01H 9/16* (2006.01)
*H03M 1/10* (2006.01)

(52) U.S. Cl.
CPC ............... *G01R 27/20* (2013.01); *G01V 1/22* (2013.01); *G01V 1/28* (2013.01); *H01H 9/16* (2013.01); *H03M 1/1071* (2013.01)

(58) Field of Classification Search
CPC ...... G01P 15/20; G01P 15/125; G01P 15/131; G01P 15/0802
See application file for complete search history.

(56) References Cited

U.S. PATENT DOCUMENTS

| | | | |
|---|---|---|---|
| 4,276,619 A * | 6/1981 | Rickenbacker | G01V 1/181 324/511 |
| 5,550,787 A | 8/1996 | Rialan et al. | |
| 5,600,318 A * | 2/1997 | Li | G01V 1/247 341/143 |
| 8,104,346 B2 | 1/2012 | Paulson | |
| 9,335,429 B2 * | 5/2016 | Melanson | G01V 1/181 |
| 2004/0239346 A1 | 12/2004 | Iyer et al. | |
| 2006/0028208 A1 | 2/2006 | Strack et al. | |

* cited by examiner

200

202 — generating at least one test signal using a digital to analog converter "DAC" circuitry, wherein the DAC circuitry includes an output operatively connected to earth ground

204 — alternately grounding a positive path to an analog to digital converter "ADC" circuitry during a first time window and a negative path to the analog to digital converter during a second time window while measuring an ADC signal

206 — determining an average amplitude of the first time window and the second time window

208 — determining a leakage resistance based upon, at least in part, the average amplitude of the first time window and the second time window

FIG. 2

SYSTEM AND METHOD FOR ELECTRIC CURRENT LEAKAGE DETECTION IN A LAND SEISMIC SYSTEM

CROSS-REFERENCE TO RELATED APPLICATION

This application claims the benefit of U.S. Provisional Patent Application Ser. No. 62/308,247 filed Mar. 15, 2016, which is incorporated herein by reference in its entirety.

BACKGROUND

In the oil and gas industry, geophysical prospecting techniques are commonly used to aid in the search for and evaluation of subterranean hydrocarbon deposits. Generally, a seismic energy source is used to generate a seismic signal that propagates into the earth and is at least partially reflected by subsurface seismic reflectors (i.e., interfaces between underground formations having different acoustic impedances). The reflections may be recorded by seismic detectors located at or near the surface of the earth, in a body of water, or at known depths in boreholes, and the resulting seismic data may be processed to yield information relating to the location of the subsurface reflectors and the physical properties of the subsurface formations. Land systems often include a large number of sensors that are connected by cables, to a central recording station. Power and data are transmitted by way of the cables. Ground leakage is a common problem in land systems. A particular problem is the earth leakage between the geophone string and the ground in analog systems.

SUMMARY

In one implementation, a method for leakage detection in a land seismic system may include generating at least one test signal using a digital to analog converter "DAC" circuitry, wherein the DAC circuitry includes an output operatively connected to earth ground. The method may further include alternately grounding a positive path to an analog to digital converter "ADC" circuitry during a first time window and a negative path to the analog to digital converter during a second time window while measuring an ADC signal. The method may also include determining an average amplitude of the first time window and the second time window and determining a leakage resistance based upon, at least in part, the average amplitude of the first time window and the second time window.

In some implementations, the DAC circuitry may be configured to generate at least one of an AC signal or a DC signal. Alternately grounding may include grounding one path in each time window. Determining an average amplitude of the first time window and the second time window may include applying a Fourier transform. Determining a leakage resistance may be based upon, at least in part, a filter component value. The land seismic system may include at least one geophone operatively connected with a digitizer unit. The digitizer unit may include anti-aliasing, common mode filters, protection circuitry, and the ADC circuitry.

In another implementation a land seismic system for electric current leakage detection between a geophone string and ground is provided. The system may include digital to analog converter "DAC" circuitry configured to generate at least one test signal, wherein the DAC circuitry includes an output operatively connected to earth ground. The system may further include analog to digital converter "ADC" circuitry, wherein the system is configured to alternately ground a positive path to the ADC circuitry during a first time window and a negative path to the analog to digital converter during a second time window while measuring an ADC signal. The system may include a computing device configured to determine an average amplitude of the first time window and the second time window and to determine a leakage resistance based upon, at least in part, the average amplitude of the first time window and the second time window.

In some implementations, the DAC circuitry may be configured to generate at least one of an AC signal or a DC signal. Alternately grounding may include grounding one path in each time window. Determining an average amplitude of the first time window and the second time window may include applying a Fourier transform. Determining a leakage resistance may be based upon, at least in part, a filter component value. The land seismic system may include at least one geophone operatively connected with a digitizer unit. The digitizer unit may include anti-aliasing, common mode filters, protection circuitry, and the ADC circuitry.

In yet another implementation, a circuit for use in a land seismic system for leakage detection is provided. The circuit may include digital to analog converter "DAC" circuitry configured to generate at least one test signal, wherein the DAC circuitry includes an output operatively connected to earth ground. The circuit may further include analog to digital converter "ADC" circuitry, wherein the system is configured to alternately ground a positive path to the ADC during a first time window and a negative path to the analog to digital converter during a second time window while measuring an ADC signal. The circuit may further include a filter connected to each of the DAC circuitry and the ADC circuitry, a first pair of switches operatively connected to the DAC circuitry, a second pair of switches operatively connected to the ADC circuitry, and a leakage detection resistor configured to detect leakage associated with a geophone string that is electrically connected with at least one of the ADC circuitry and the DAC circuitry.

In some implementations, the DAC circuitry may be configured to generate at least one of an AC signal or a DC signal. Alternately grounding may include grounding one path in each time window. Determining an average amplitude of the first time window and the second time window may include applying a Fourier transform. Determining a leakage resistance may be based upon, at least in part, a filter component value. The digitizer unit may include anti-aliasing, common mode filters, protection circuitry, and the ADC circuitry.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Embodiments of the present disclosure are described with reference to the following figures.

FIG. 2 is a flow diagram of a process in accordance with one or more embodiments of the present disclosure;

Like reference symbols in the various drawings may indicate like elements.

DETAILED DESCRIPTION

Various embodiments described herein are directed to a method, a system and an apparatus for seismic exploration, and more particularly to land seismic exploration systems and electric current leakage detection relating to such. In land seismic surveying, impulsive signals are sent into the ground (often times by vibrator trucks, but sometimes with explosives). The impulsive signals travel into the ground and reflect and/or reverberate in response to encountering the formation. The resulting signals can travel back to the surface of the ground where they are detected and recorded by seismic sensors such as geophones, accelerometers, MEMS, and/or hydrophones. The detected signals can be recorded and analyzed to provide information about the underlying formation, such as the presence or lack thereof of hydrocarbons or other minerals. Land systems often include a large number of sensors that are connected by cables, to a central recording station. Power and data are transmitted by way of the cables. Embodiments of the present disclosure relate to ground leakage, and in turn, identification and reduction of ground leakage. As such, embodiments discussed herein include a design that identifies ground leakage in a land seismic survey system such as that described below with reference to FIG. 1.

Figure 1:
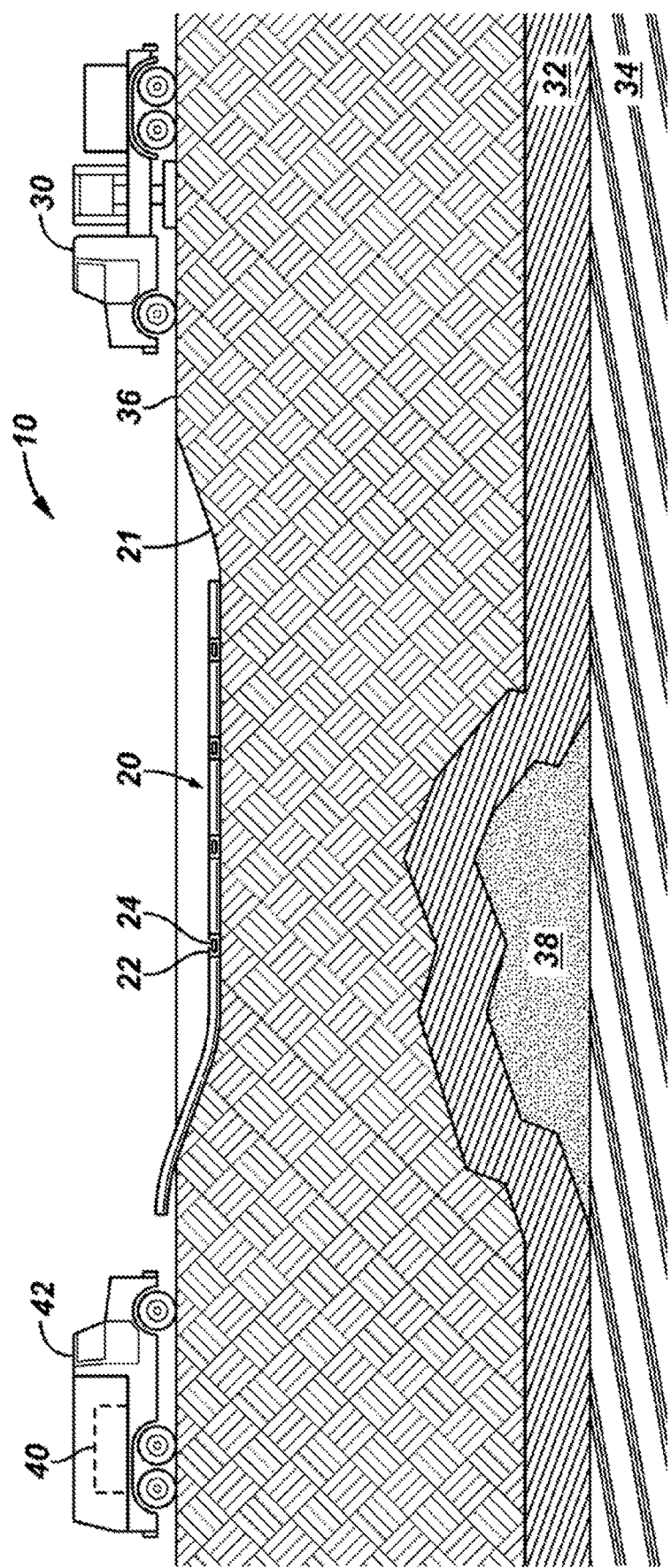
FIG. 1 is a schematic illustration of a deployed seismic cable according to one or more embodiments of the present disclosure.

FIG. 1 depicts an embodiment of a land seismic data acquisition system 10 in accordance with some embodiments of the disclosure. For the purposes of this disclosure, "land" applications may include seismic data acquisition in transition zone areas, such as marshes, wetlands and other shallow water applications. In the system 10, a seismic cable 20 for use in acquiring seismic data in land applications lies in a trench 21 formed in a terrain of interest. While only one section of the seismic cable 20 is shown in FIG. 1, it is to be appreciated that the seismic cable 20 may be formed of a plurality of sections coupled to one another. In some embodiments, the seismic cable 20 may extend several thousand meters long and may contain various support cables (not shown), as well as wiring and/or circuitry (not shown) that may be used to support communication along the cable 20. The cable 20 generally includes sensor units 22, which house seismic sensors 24 that record seismic signals.

In accordance with embodiments of the disclosure, the seismic sensors 24 may be pressure sensors only, particle motion sensors only, or may be multi-component seismic sensors. For the case of multi-component seismic sensors, the sensors may be capable of detecting a pressure wavefield and at least one component of a particle motion that is associated with acoustic signals that are proximate to the multi-component seismic sensor. Examples of particle motions include one or more components of a particle displacement, one or more components (inline (x), crossline (y) and vertical (z) components) of a particle velocity and one or more components of a particle acceleration.

Depending on the particular embodiment of the disclosure, the multi-component seismic sensors may include one or more geophones, hydrophones, particle displacement sensors, optical sensors, particle velocity sensors, accelerometers, pressure gradient sensors, or combinations thereof.

For example, in accordance with some embodiments of the disclosure, a particular multi-component seismic sensor may include three orthogonally-aligned accelerometers (e.g., a three-component micro electro-mechanical system (MEMS) accelerometer) to measure three corresponding orthogonal components of particle velocity and/or acceleration near the seismic sensor. In such embodiments, the MEMS-based sensor may be a capacitive MEMS-based sensor of the type described in U.S. patent application Ser. No. 12/268,064, which is incorporated herein by reference. Of course, other MEMS-based sensors may be used according to the present disclosure. In some embodiments, a hydrophone for measuring pressure may also be used with the three-component MEMS described herein.

It is noted that the multi-component seismic sensor may be implemented as a single device or may be implemented as a plurality of devices, depending on the particular embodiment of the disclosure. A particular multi-component seismic sensor may also include pressure gradient sensors, which constitute another type of particle motion sensors. Each pressure gradient sensor measures the change in the pressure wavefield at a particular point with respect to a particular direction. For example, one of the pressure gradient sensors may acquire seismic data indicative of, at a particular point, the partial derivative of the pressure wavefield with respect to the crossline direction, and another one of the pressure gradient sensors may acquire, at a particular point, seismic data indicative of the pressure data with respect to the inline direction.

It is noted that measurements acquired by a particle motion sensor are susceptible to noise. For purposes of substantially canceling, or attenuating, this noise, the sensor units 22 may include a rotation sensor. More specifically, the rotation sensor measures a torque noise, which serves as a basis for estimating a noise (such as a torque noise, for example) that is present in the measurement that is acquired by the particle motion sensor. Given the estimate, the noise may be significantly removed, or attenuated.

The system 10 generally includes a seismic source, such as a vibrator truck 30, which may be used to impart seismic vibrations into the earth's surface. Of course, other methods for generating seismic vibrations may be used, such as dynamite, air guns, etc. Acoustic signals, often referred to as "shots," are produced by the seismic source 30 and are directed down through strata 32 and 34 beneath the earth's surface 36. The acoustic signals are reflected from the various subterranean geological formations, such as an exemplary formation 38 that is depicted in FIG. 1. The incident acoustic signals that are generated by the source 30 produce corresponding reflected acoustic signals, or pressure waves, which are sensed by the seismic sensors 24 disposed in the cable 20.

The seismic sensors 24 generate signals (digital signals, for example), called "traces," which indicate the acquired measurements of the pressure wavefield and particle motion (if the sensors are particle motion sensors). The traces are recorded and may be at least partially processed by a signal processing unit 40 deployed in or near the survey region, in accordance with some embodiments of the disclosure. The signal processing unit 40 may, for example, be disposed in a recording truck 42 movably positioned at various locations of the survey region. A particular multi-component seismic sensor may provide a trace, which corresponds to a measure of a pressure wavefield by its hydrophone; and the sensor may provide one or more traces that correspond to one or more components of particle motion, which are measured by its accelerometers, for example.

The goal of the seismic acquisition is to build up an image of a survey area for purposes of identifying subterranean geological formations, such as the exemplary geological formation 38. Subsequent analysis of the representation may reveal probable locations of hydrocarbon deposits in subterranean geological formations. Depending on the particular embodiment of the disclosure, portions of the analysis of the representation may be performed proximate the survey region, such as by the signal processing unit 40.

Referring now to FIGS. 2-5, embodiments of a leakage detection process that may be used with a system such as that shown in FIG. 1 is provided. An analog seismic surveying system for land may be an analog based system and may include geophones and/or geophone strings that may be connected to a digitizer unit (such as those discussed in further detail below) that has anti-aliasing, common mode filters, protection circuitry and an Analog to Digital Converter "ADC" to convert the analog signal to a digital signal. A Digital to Analog Converter "DAC" may be used to generate test signals. In some embodiments, the digitizer units may be connected to each other through a network that collects the data and transmits the data to a central system where the data is recorded.

Referring to FIG. 2, an embodiment depicting operations consistent with implementations of the leakage detection process described herein is provided. Embodiments may include generating (202) at least one test signal using a digital to analog converter "DAC" circuitry, wherein the DAC circuitry includes an output operatively connected to earth ground. Embodiments may further include alternately grounding (204) a positive path to an analog to digital converter "ADC" circuitry during a first time window and a negative path to the analog to digital converter during a second time window while measuring an ADC signal. Embodiments may additionally include determining (206) an average amplitude of the first time window and the second time window and determining (208) a leakage resistance based upon, at least in part, the average amplitude of the first time window and the second time window.

Figure 3:
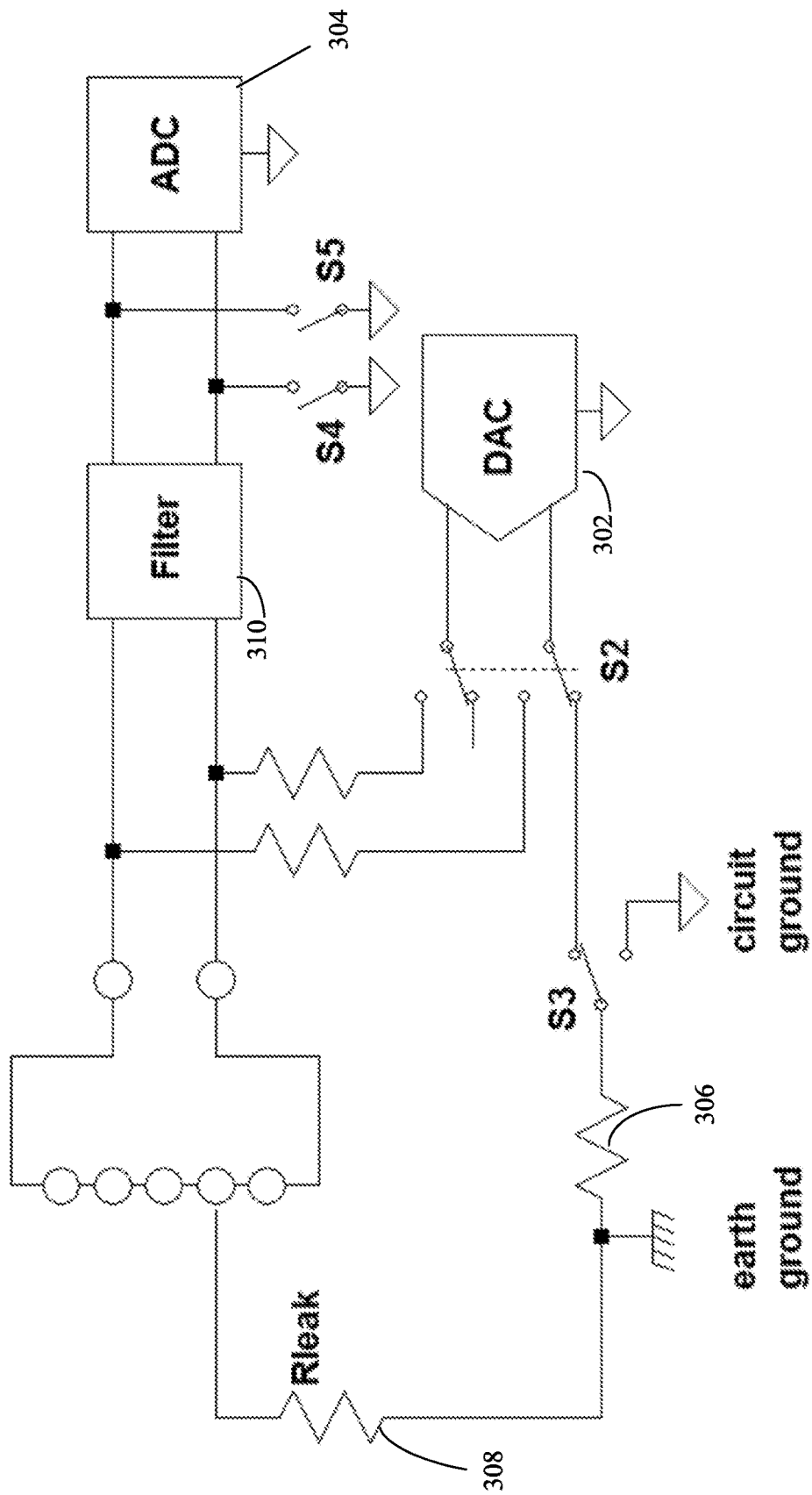
FIG. 3 is a diagrammatic view of an apparatus for leakage detection in a land seismic in accordance with embodiments of the present disclosure.

During the acquisition process leakage in the geophone string to the Earth potential may occur. As discussed in further detail herein below with reference to FIG. 3, it may not be necessary to disconnect the geophone string by utilizing one or more switches in the signal path to measure the leakage. A signal from DAC 302 may be sent to the Earth connection on the digitizer housing. As shown in FIG. 3 the signal may be traveling through switches S2 and S3 and through a possible protection resistor 306 to the Earth contact, as shown. The leakage resistance is shown as resistor $R_{leak}$ 308 and any leaked signal be picked up by ADC 304 as illustrated in FIG. 3. If there is a leakage somewhere in the geophone string then the signal sent from the DAC 302 may be picked up and read by the ADC 304. Two measurements may be performed with the positive and negative paths to ADC 304 alternatingly grounded (e.g., to the internal ground by switches S4 and S5 as shown in FIG. 3) in two separate time windows during the time the DAC test signal is activated. In case of a leakage it may be shown that the average amplitude of the signal being picked up by the ADC 304 during the two time windows may be constant regardless of where in the geophone string the leakage happens. The signal may be a DC signal or an AC signal (e.g., 31.25 Hz). This average amplitude may then be used to calculate the leakage resistance. Using an AC signal provides effectively the electric leakage resistance at that frequency. If several frequencies are used successively or together an estimate of leakage resistance at each frequency can be generated.

In FIG. 3 it should be noted that there are no switches that disconnect the signal path from ADC 304 thus removing weak points introduced by such switches. Switches in a signal path inversely affect signal quality due to finite attributes like introducing distortion and impedance in the signal path. In some embodiments, switch S3 may commute the end of R between S2 or circuit ground. Additionally and/or alternatively, circuit ground and earth ground may be referred to as system nodes. In some embodiments, switch S1 may not have any independent function and may be linked with S2.

As discussed above, in accordance with some embodiments an analog system may include a geophone/geophones string connected to a digitizer unit 300 that may include one or more components. Some of these may include, but are not limited to, anti-aliasing and/or common mode filters 310, protection circuitry and ADC 304 to convert the analog signal to a digital signal. DAC 302 may be used to generate test signals. Leakage may occur from the geophone string that may be laid out on the ground to Earth potential. In previous systems any possible leakage may be measured using a set of switches in the signal path on the digitizer unit. Embodiments of the present disclosure remove the need for switches in the signal path.

It should be noted that having switches in the signal path introduces weak points that may contribute to distortion and may introduce unwanted impedance that can affect the common mode rejection response of the digitizer unit. As discussed above, embodiments included herein may be configured to avoid using switches in the signal path.

In operation, DAC 302 in the digitizer unit may transmit a signal to the Earth contact outside the digitizer unit. The DAC signal, as shown in FIG. 3, may pass through switches S2 and S3 and possibly through protection resistor 306 to the Earth contact. If any leakage is present then $R_{leak}$ has a finite value due to leakage of the geophone string. In this case the signal that is sent by DAC 302 may be picked up by the ADC 304. The leakage can, however, happen anywhere in the geophone string. During the time that DAC signal may be activated each of the two signal paths may be grounded in separate time windows (e.g., grounding switches are shown in FIG. 3 by switches S4 and S5). In case of leakage and regardless of where the leakage happens in the string the average of the amplitude measured by ADC 304 at the signal frequency may be related to the leakage resistance and is constant ignoring the noise. The relation between this amplitude and the leakage resistance is deterministic and may be determined by the values of the components of the filter/filters 310. The relationship may be determined based on the component values discrete elements in filter/filters 310. There may be some deviation due to the components' tolerances and system and environment noise. In some embodiments, the signal amplitude may be determined by taking the Fourier transform in the two time windows when the signal is activated or any other numerical method.

Additionally and/or alternatively, in some embodiments, the leakage detection process may include one or more of the following operations. Activating the DAC signal (e.g., DC or AC), with its output connected to Earth GND (ground) by circuitry. Grounding each signal path alternatingly in two separate time windows (e.g., one path grounded in each time window) while reading the signal by the ADC. Determining the average amplitude, of the two time windows, by applying a Fourier transform at that frequency or any other numerical method. Using the formula defined by filter's component values, values for resistors and capacitors in the filter/filters, etc., and the calculated average amplitude above to determine the leakage resistance.

Figure 4:
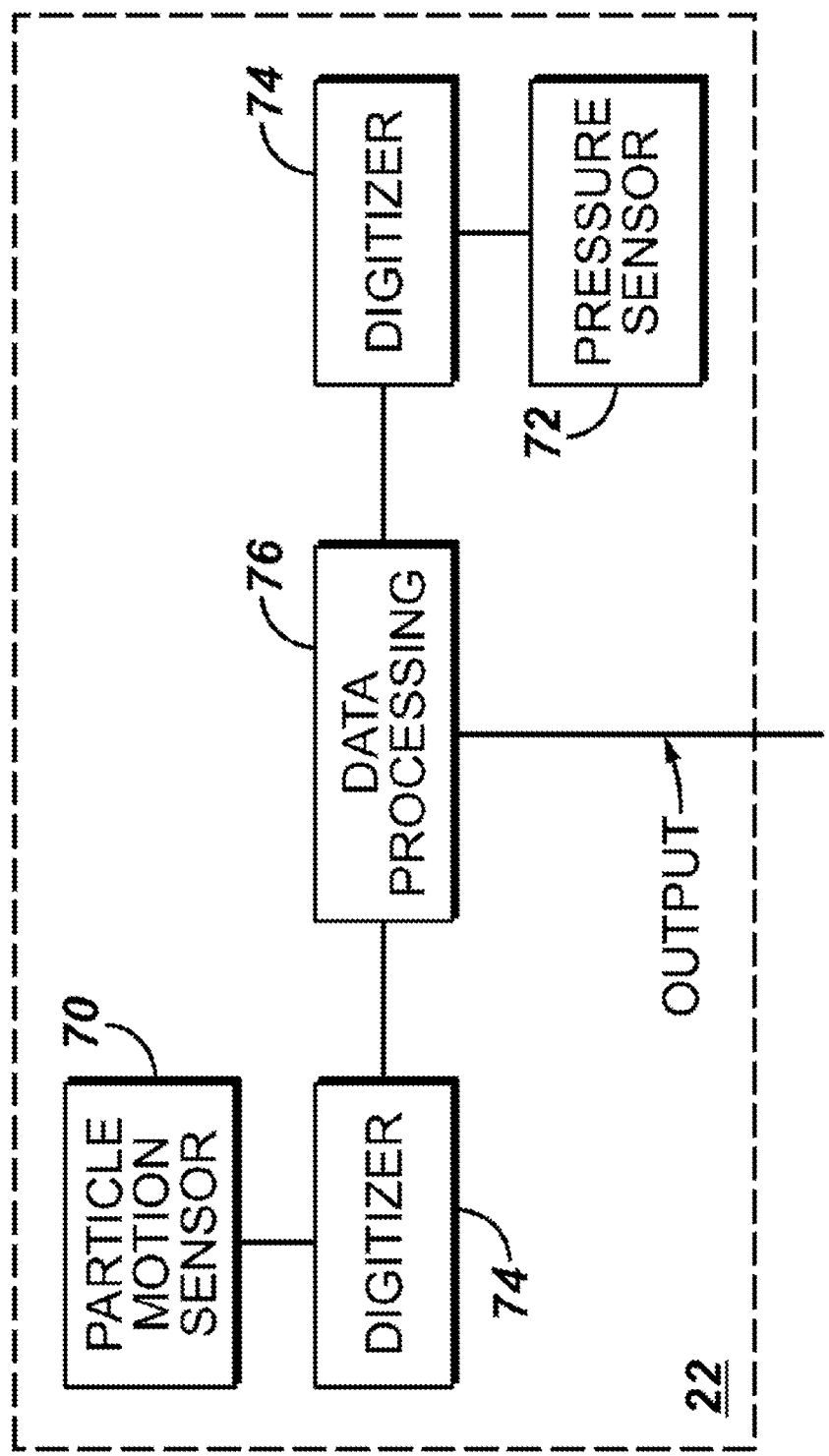
FIG. 4 is a block diagram illustrating exemplary components of a sensor housing that may incorporate the leakage detection process in accordance with embodiments of the present disclosure.

In one embodiment, and with reference to FIG. 4, the sensor unit 22, which may include some or all of the components described above in FIG. 3, may include a particle motion sensor 70, which may be a 3-component geophone accelerometer (GAC), a 3-component MEMS-based sensor, or an optical sensor, and a pressure sensor 72, which may be a hydrophone. Additional electronics may be provided in the sensor unit, such as digitizers 74, for digitizing the seismic signal before passing it to a central processing unit (CPU) 76. In some embodiments, the sensor unit 22 may output an analog signal, which may then be digitized elsewhere, such as in the recording truck 42. The output of the sensor unit 22 may be one component (e.g., vertical component after data processing or pressure wave), two component (e.g., vertical component after data processing and pressure wave), three component (e.g., two particle motion measurements and pressure wave or three particle motion measurements), or four component (three component particle motion measurements and pressure wave). The sensor units 22 may be densely distributed along the cable 20 to achieve desired spatial sampling. For example, the sensor units 22 may be distributed along the cable 20 at intervals of 1 m, 5 m, 10 m depending on the desired spatial sampling. In other embodiments, the spacing may be at intervals of 6.25 m, 12.5 m, 25 m, or 50 m. Other spacing intervals are contemplated as different sensor types may have different sensor spacings.

Figure 5:
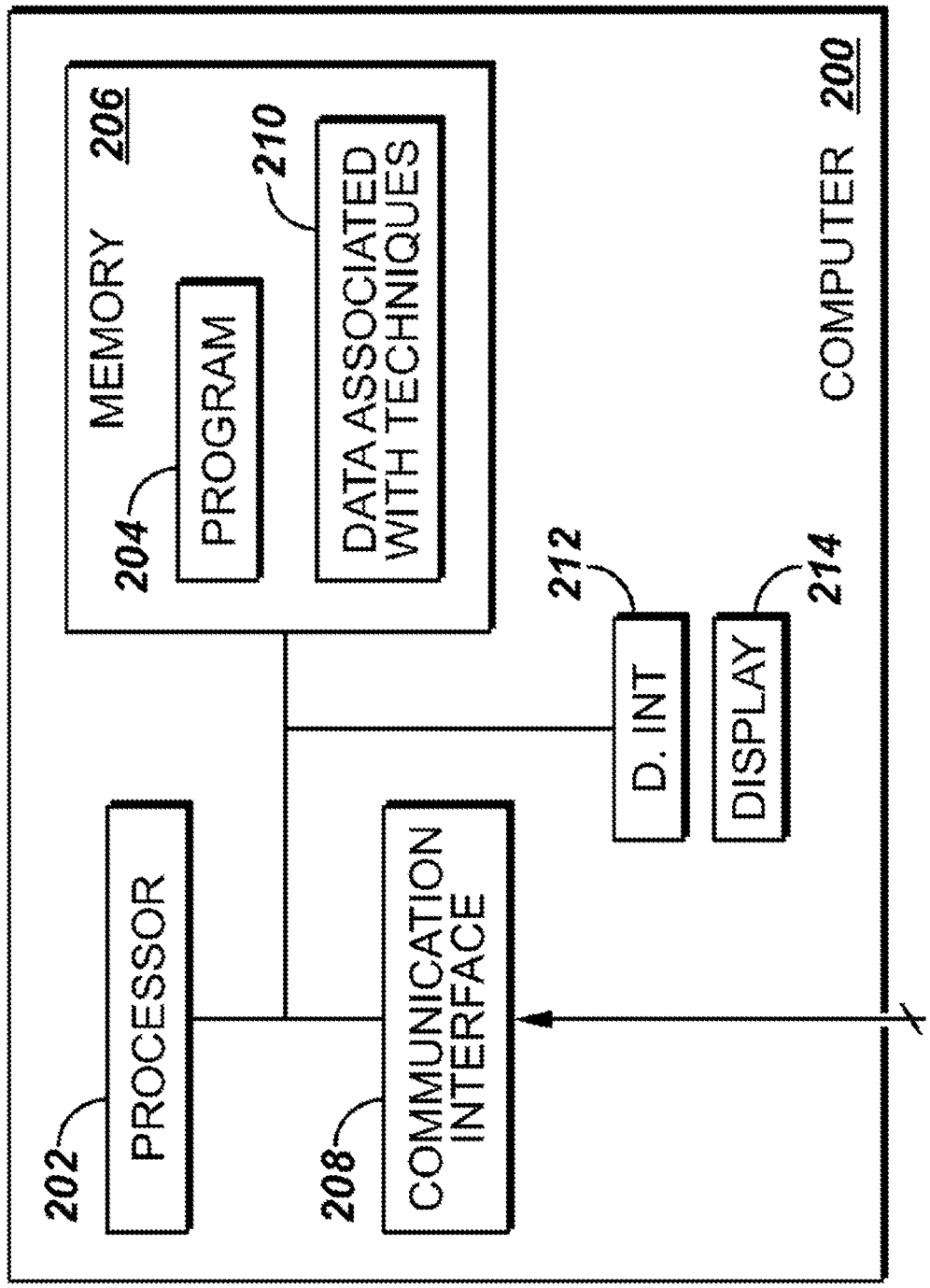
FIG. 5 illustrates a schematic diagram of a data processing system for carrying out processing techniques according to the present disclosure.

Referring to FIG. 5, in accordance with some embodiments of the present disclosure, a data processing system 200 may include a processor 202 that may be constructed to execute at least one program 204 (stored in a memory 206) for purposes of processing data to perform one or more of the techniques that are disclosed herein. The processor 202 may be coupled to a communication interface 208 for purposes of receiving data. In addition to storing instructions for the program 204, the memory 206 may store preliminary, intermediate and final datasets involved in the techniques (data associated with techniques 110) that are disclosed herein. The pre-defined quality indicators, for example, may be stored in such a manner. Among its other features, the data processing system 200 may include a display interface 212 and display 214 for purposes of displaying the various data that is generated as described herein.

The control unit may guide the deployment vehicle to deploy the sensor units 22 at optimal positions in the survey region to ensure compliance with survey requirements. Deploying the sensor units 22 according to pre-defined quality indicators will also improve the quality of the survey. In particular, it may reduce errors in the sensor unit recordings, thus minimizing the need to compensate for errors in position, tilt, etc. As can be appreciated, such errors are common with conventional deployment techniques in which laborers physically deploy the sensor units 22. In some embodiments, the sensor units 22 may be tested after deployment to ensure compliance with the quality indicators. If it is determined that the sensor units 22 are not appropriately positioned, then correction can be made.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some embodiments, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used in any embodiment described herein, the term "circuitry" may comprise, for example, singly or in any combination, hardwired circuitry, programmable circuitry, state machine circuitry, and/or firmware that stores instructions executed by programmable circuitry. It should be understood at the outset that any of the operations and/or operative components described in any embodiment or embodiment herein may be implemented in software, firmware, hardwired circuitry and/or any combination thereof.

The terminology used herein is for the purpose of describing particular embodiments and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Although a few example embodiments have been described in detail above, those skilled in the art will readily appreciate that many modifications are possible in the example embodiments without materially departing from the system described herein. Accordingly, such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

Having thus described the disclosure of the present application in detail and by reference to embodiments thereof, it will be apparent that modifications and variations are possible without departing from the scope of the disclosure defined in the appended claims.

What is claimed is:

1. A method for electric current leakage detection in a land seismic system comprising:
    generating at least one test signal using a digital to analog converter "DAC" circuitry, wherein the DAC circuitry includes an output operatively connected to earth ground;
    alternately grounding a positive path to an analog to digital converter "ADC" circuitry during a first time window and a negative path to the analog to digital converter during a second time window while measuring an ADC signal;
    determining an average amplitude of the first time window and the second time window; and
    determining a leakage resistance based upon, at least in part, the average amplitude of the first time window and the second time window.

2. The method for leakage detection of claim 1, wherein the DAC circuitry is configured to generate at least one of an AC signal or a DC signal.

3. The method for leakage detection of claim 1, wherein alternately grounding includes grounding one path in each time window.

4. The method for leakage detection of claim 1, wherein determining an average amplitude of the first time window and the second time window includes applying a Fourier transform.

5. The method for leakage detection of claim 1, wherein determining a leakage resistance is based upon, at least in part, a filter component value.

6. The method for leakage detection of claim 1, wherein the land seismic system includes at least one geophone operatively connected with a digitizer unit.

7. The method for leakage detection of claim 6, wherein the digitizer unit includes anti-aliasing, common mode filters, protection circuitry, and the ADC circuitry.

8. A land seismic system for electric current leakage detection comprising:
    digital to analog converter "DAC" circuitry configured to generate at least one test signal, wherein the DAC circuitry includes an output operatively connected to earth ground;
    analog to digital converter "ADC" circuitry, wherein the system is configured to alternately ground a positive path to the ADC circuitry during a first time window and a negative path to the analog to digital converter during a second time window while measuring an ADC signal; and
    a computing device configured to determine an average amplitude of the first time window and the second time window and to determine a leakage resistance based upon, at least in part, the average amplitude of the first time window and the second time window.

9. The land seismic system for leakage detection of claim 8, wherein the DAC circuitry is configured to generate at least one of an AC signal or a DC signal.

10. The land seismic system for leakage detection of claim 8, wherein alternately grounding includes grounding one path in each time window.

11. The land seismic system for leakage detection of claim 8, wherein determining an average amplitude of the first time window and the second time window includes applying a Fourier transform.

12. The land seismic system for leakage detection of claim 8, wherein determining a leakage resistance is based upon, at least in part, a filter component value.

13. The land seismic system for leakage detection of claim 8, wherein the land seismic system includes at least one geophone operatively connected with a digitizer unit.

14. The land seismic system for leakage detection of claim 13, wherein the digitizer unit includes anti-aliasing, common mode filters, protection circuitry, and the ADC circuitry.

15. A circuit for use in a land seismic system for electric current leakage detection comprising:
    digital to analog converter "DAC" circuitry configured to generate at least one test signal, wherein the DAC circuitry includes an output operatively connected to earth ground;
    analog to digital converter "ADC" circuitry, wherein the system is configured to alternately ground a positive path to the ADC during a first time window and a negative path to the analog to digital converter during a second time window while measuring an ADC signal;
    a filter connected to each of the DAC circuitry and the ADC circuitry;
    a first pair of switches operatively connected to the DAC circuitry;
    a second pair of switches operatively connected to the ADC circuitry; and
    a leakage detection resistor configured to detect leakage associated with a geophone string that is electrically connected with at least one of the ADC circuitry and the DAC circuitry.

16. The circuit for use in a land seismic system for leakage detection of claim 15, wherein the DAC circuitry is configured to generate at least one of an AC signal or a DC signal.

17. The circuit for use in a land seismic system for leakage detection of claim 15, wherein alternately grounding includes grounding one path in each time window.

18. The circuit for use in a land seismic system for leakage detection of claim 15, wherein determining an average amplitude of the first time window and the second time window includes applying a Fourier transform.

19. The circuit for use in a land seismic system for leakage detection of claim 15, wherein determining a leakage resistance is based upon, at least in part, a filter component value.

20. The circuit for use in a land seismic system for leakage detection of claim 19, wherein the digitizer unit includes anti-aliasing, common mode filters, protection circuitry, and the ADC circuitry.

* * * * *